United States Patent
Yoo et al.

(10) Patent No.: US 11,147,154 B2
(45) Date of Patent: Oct. 12, 2021

(54) MULTI INPUT AND MULTI OUTPUT ANTENNA APPARATUS

(71) Applicant: KMW INC., Hwaseong-si (KR)

(72) Inventors: Chang Woo Yoo, Hwaseong-si (KR); Min Sik Park, Hwaseong-si (KR); Jin Soo Yeo, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 0 days.

(21) Appl. No.: 17/065,739

(22) Filed: Oct. 8, 2020

(65) Prior Publication Data

US 2021/0029819 A1 Jan. 28, 2021

Related U.S. Application Data

(63) Continuation of application No. PCT/KR2019/004357, filed on Apr. 11, 2019.

(30) Foreign Application Priority Data

Apr. 11, 2018 (KR) .......................... 10-2018-0041987
Apr. 11, 2019 (KR) .......................... 10-2019-0042379

(51) Int. Cl.
*H04W 88/02* (2009.01)
*H04B 1/40* (2015.01)
(Continued)

(52) U.S. Cl.
CPC ............. *H05K 1/0204* (2013.01); *H01Q 1/02* (2013.01); *H01Q 21/00* (2013.01); *H04B 1/40* (2013.01); *H05K 2201/10098* (2013.01)

(58) Field of Classification Search
None
See application file for complete search history.

(56) References Cited

U.S. PATENT DOCUMENTS 7,366,553 B1 * 4/2008 Shields .................. H01Q 1/246
343/700 MS
8,045,329 B2 * 10/2011 Chen ...................... H01Q 1/422
361/699
(Continued)

FOREIGN PATENT DOCUMENTS

JP 2017-046121 A 3/2017
JP 2017-063288 A 3/2017
(Continued)

OTHER PUBLICATIONS

International Search Report for PCT/KR2019/004357 dated Jul. 16, 2019 and its English translation.

*Primary Examiner* — Tuan A Tran
(74) *Attorney, Agent, or Firm* — Seung Ho Lee

(57) ABSTRACT

The present disclosure relates to a multi input and multi output antenna apparatus. The multi input and multi output antenna apparatus may include: an antenna board having a plurality of antenna elements arranged on a front surface thereof; and a transmitting/receiving module board having a plurality of first heat generation elements provided on a front surface thereof and a plurality of second heat generation elements provided on a rear surface thereof, and disposed to have a separation space from the antenna board. The heat generated from the plurality of first heat generation elements may be radiated to the front of the transmitting/receiving module board, and the heat generated from the plurality of second heat generation elements may be radiated to the rear of the transmitting/receiving module board.

14 Claims, 15 Drawing Sheets

(51) Int. Cl.
*H05K 1/02* (2006.01)
*H01Q 1/02* (2006.01)
*H01Q 21/00* (2006.01)

(56) References Cited

U.S. PATENT DOCUMENTS

| | | | | |
|---|---|---|---|---|
| 8,497,813 | B2* | 7/2013 | Rodger | H01Q 21/06 |
| | | | | 343/872 |
| 8,659,901 | B2* | 2/2014 | MacManus | H01Q 1/02 |
| | | | | 361/709 |
| 8,797,226 | B2* | 8/2014 | Ferris | H01Q 1/246 |
| | | | | 343/872 |
| 9,083,414 | B2* | 7/2015 | Basnayake | H04B 7/0413 |
| 9,107,326 | B2* | 8/2015 | MacManus | H05K 7/20127 |
| 9,356,359 | B2* | 5/2016 | Ma | H01Q 1/42 |
| 9,825,354 | B2* | 11/2017 | Hu | H01Q 9/16 |
| 10,028,154 | B2* | 7/2018 | Elson | H04B 7/0456 |
| 10,128,563 | B2* | 11/2018 | Lin | H01Q 1/48 |
| 10,147,996 | B2* | 12/2018 | Bose | H01Q 1/1214 |
| 10,205,472 | B2* | 2/2019 | Hu | F28F 3/02 |
| 10,224,618 | B2* | 3/2019 | Martinez Ortigosa | H01Q 1/48 |
| 10,263,476 | B2* | 4/2019 | Leabman | H01Q 1/02 |
| 10,448,264 | B2* | 10/2019 | Elson | G01S 19/24 |
| 10,469,136 | B2* | 11/2019 | Kim | H04B 7/0404 |
| 10,476,150 | B2* | 11/2019 | Toyao | H01Q 19/108 |
| 10,506,702 | B2* | 12/2019 | Hayakawa | H05K 7/20 |
| 10,750,641 | B2* | 8/2020 | Egami | F28F 3/06 |
| 10,784,589 | B2* | 9/2020 | Toyao | H01Q 21/062 |
| 10,842,047 | B1* | 11/2020 | Egami | H01Q 1/02 |
| 2014/0062808 | A1* | 3/2014 | Kataoka | H01Q 1/3275 |
| | | | | 343/713 |

FOREIGN PATENT DOCUMENTS

| | | |
|---|---|---|
| KR | 10-2014-0018115 A | 2/2014 |
| KR | 10-2018-0024674 A | 3/2018 |
| WO | 2017/086377 A1 | 5/2017 |

* cited by examiner

MULTI INPUT AND MULTI OUTPUT ANTENNA APPARATUS

CROSS-REFERENCE TO RELATED APPLICATIONS

This application is a Continuation Application of International Application No. PCT/KR2019/004357, filed on Apr. 11, 2019, which claims priority and benefits of Korean Application Nos. 10-2018-0041987, filed on Apr. 11, 2018, and 10-2019-0042379, filed on Apr. 11, 2019, the disclosures of which are incorporated herein by reference in their entirety.

TECHNICAL FIELD

The present disclosure relates to a multi input and multi output antenna apparatus, and more particularly, to a multi input and multi output antenna apparatus for wireless communication.

BACKGROUND ART

A wireless communication technology, for example, the MIMO (Multiple Input Multiple Output) technology refers to a spatial multiplexing technique which significantly increases a data transfer capacity using a plurality of antennas, and in which transmitters transmits different data through transmitting antennas thereof, respectively, and receivers sort the transmitted data through proper signal processing.

Therefore, by increasing the numbers of transmitting antennas and receiving antennas at the same time, a channel capacity can be increased to transmit more data. For example, when the number of antennas is increased to 10, it is possible to secure a channel capacity ten times larger than in the current single antenna system, using the same frequency band.

The 4G LTE-advanced uses eight antennas, and a product having 64 or 128 antennas mounted thereon is developed in the current pre-5G era. Also, it is expected that base station equipment with a much larger number of antennas will be used in the 5G era. This technology is referred to as massive MIMO technology. Currently, the cell operation is performed in a 2-dimension manner. However, when the massive MIMO technology is introduced, 3D-beamforming becomes possible. Thus, the massive MIMO is also referred to as FD (Full Dimension)-MIMO.

In the massive MIMO technology, as the number of antennas is increased, the numbers of transmitters and filters are also increased. However, due to the lease cost or spatial limit of an installation place, RF parts (antenna/filter/power amplifier/transceiver etc.) need to be reduced in size and weight and manufactured at low prices, and the massive MIMO requires high power for coverage expansion. Power consumption and heat generation caused by such high power serve as negative factors in reducing the weights and sizes of the RF parts.

In particular, when a MIMO antenna in which modules having RF elements and digital elements implemented therein are coupled through a stacked structure is installed in a limited space, a plurality of layers constituting the MIMO antenna need to be reduced in weight and size, in order to maximize the ease of installation and the space utilization. In this case, there is a need for the design of a new heat radiation structure for heat generated by communication parts mounted in the plurality of layers.

DISCLOSURE

Technical Problem

Various embodiments are directed to a multi input and multi output antenna apparatus capable of implementing high power and having an excellent heat radiation characteristic.

Technical Solution

In an embodiment, a multi input and multi output antenna apparatus may include: an antenna board having a plurality of antenna elements arranged on a front surface thereof; and a transmitting/receiving module board having a plurality of first heat generation elements provided on a front surface thereof and a plurality of second heat generation elements provided on a rear surface thereof, and disposed to have a separation space from the antenna board. The heat generated from the plurality of first heat generation elements may be radiated to the front of the transmitting/receiving module board, and the heat generated from the plurality of second heat generation elements may be radiated to the rear of the transmitting/receiving module board.

Advantageous Effects

In accordance with the embodiment of the present disclosure, heat generation elements which generate a large amount of heat may be selectively concentrated to have more efficient heat radiation performance to the outside, and a product may be reduced in size, which makes it easy to additionally install a 5G multi input and multi output antenna apparatus.

MODE FOR INVENTION

Hereafter, a multi input and multi output antenna apparatus in accordance with an embodiment of the present disclosure will be described in detail with reference to the accompanying drawings.

Figure 1:
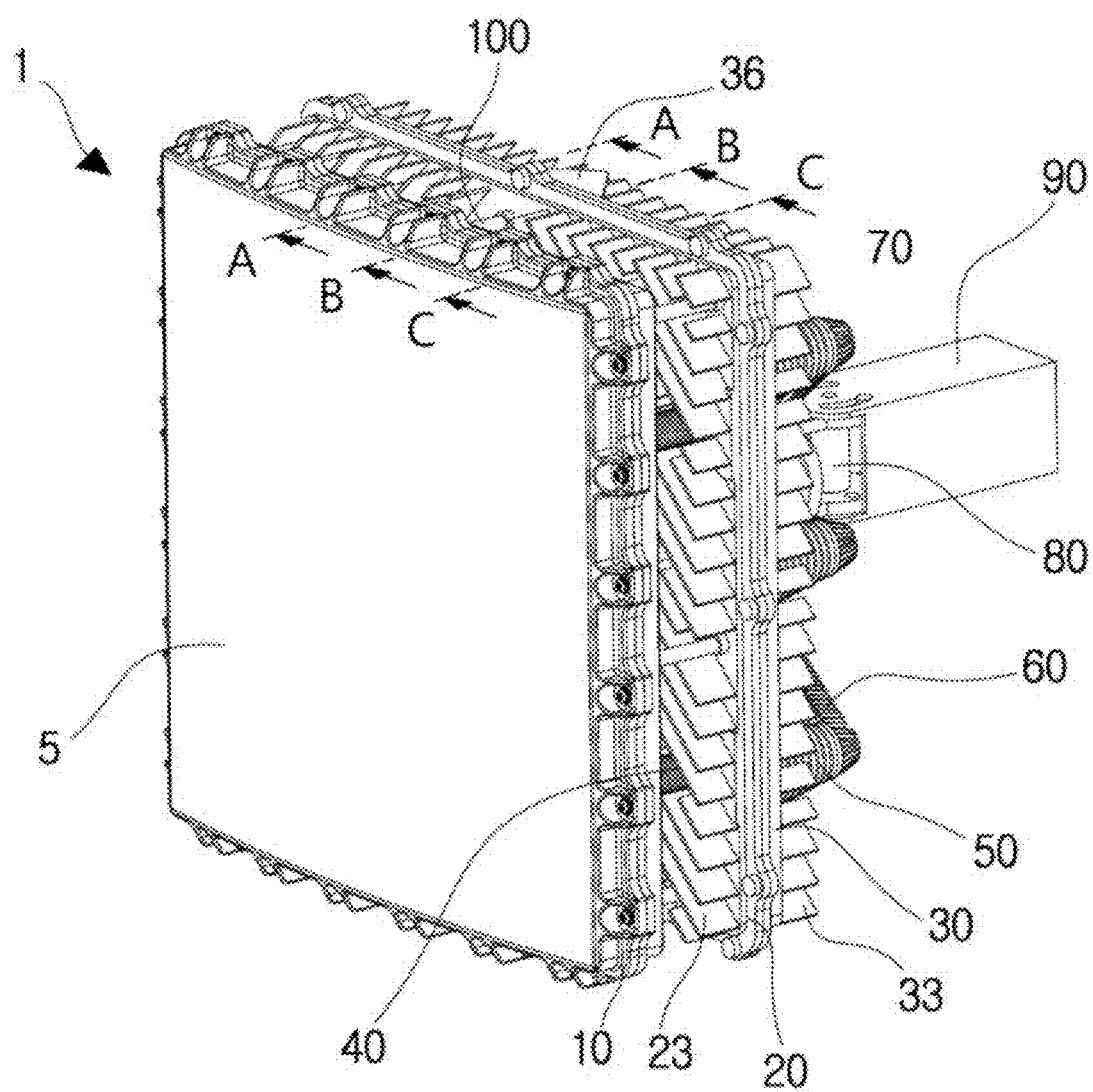
FIGS. 1 and 2 are perspective views illustrating front and rear parts of a multi input and multi output antenna apparatus in accordance with an embodiment of the present disclosure.
Figure 2:
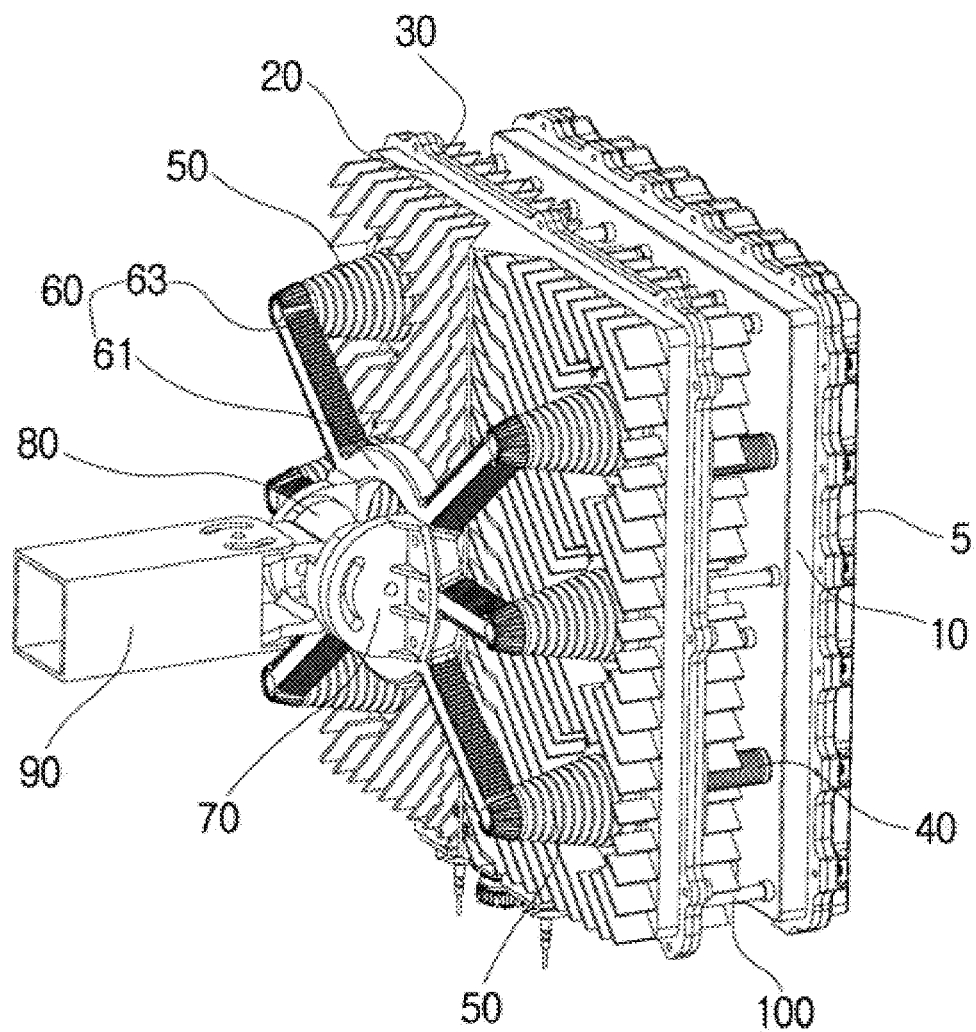
Figure 3:
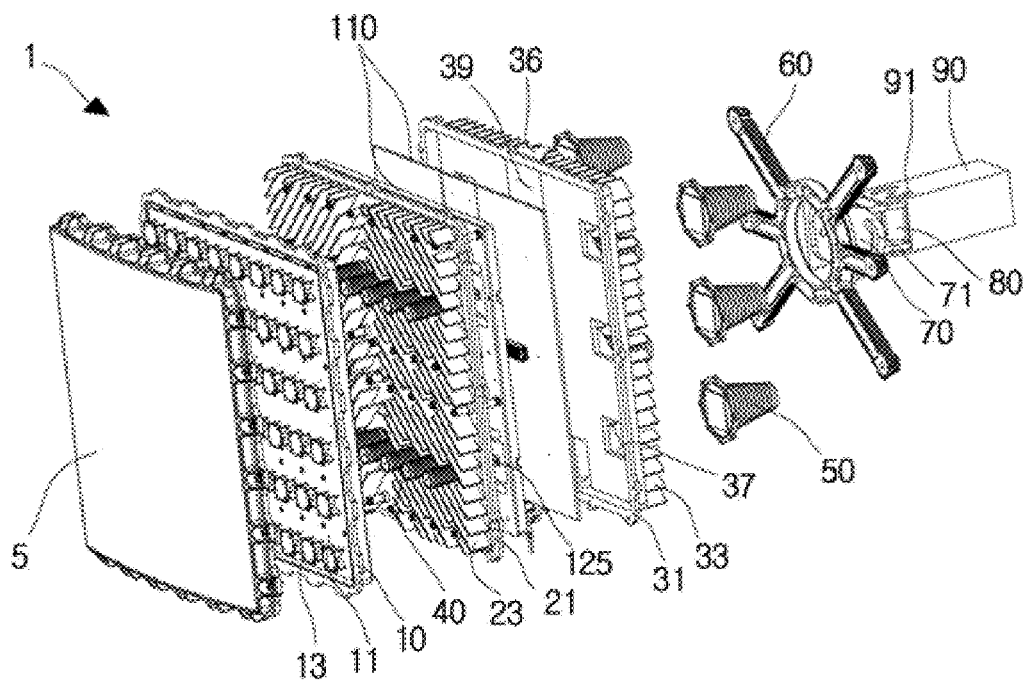
FIGS. 3 and 4 are front and rear exploded perspective views illustrating the front and rear parts of the multi input and multi output antenna apparatus of FIGS. 1 and 2.
Figure 4:
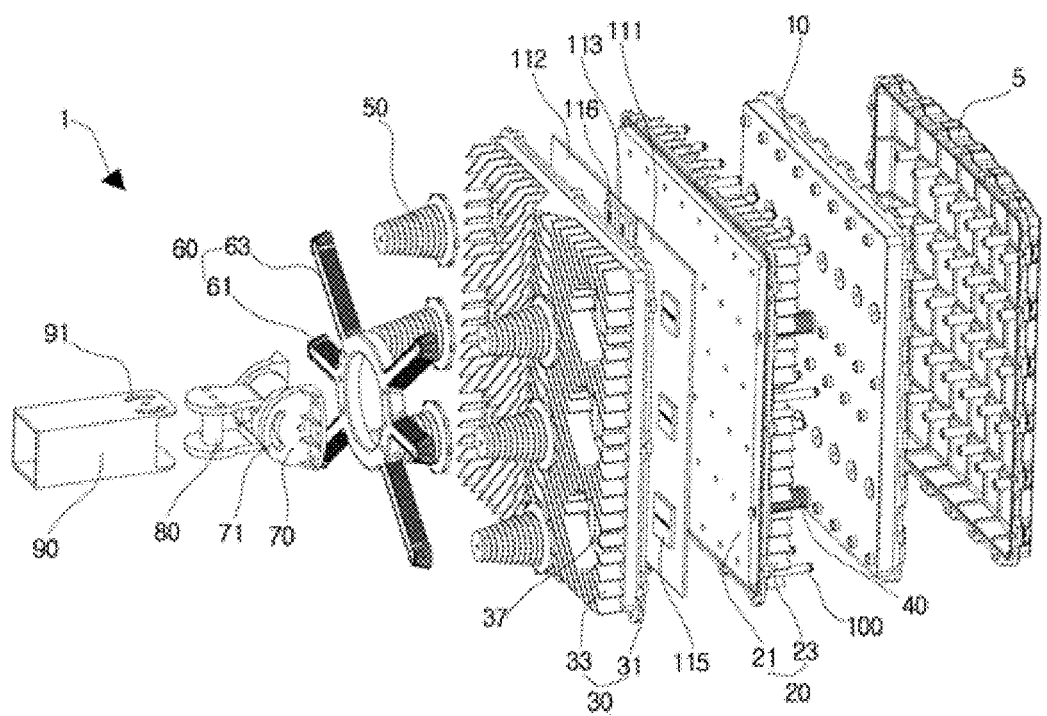

FIGS. 1 and 2 are perspective views illustrating front and rear parts of a multi input and multi output antenna apparatus in accordance with an embodiment of the present disclosure, and FIGS. 3 and 4 are front and rear exploded perspective views illustrating the front and rear parts of the multi input and multi output antenna apparatus of FIGS. 1 and 2.

A multi input and multi output antenna apparatus 1 in accordance with the embodiment of the present disclosure may receive power from a power supply module (not illustrated), and wirelessly communicate with an external terminal and base stations through a wireless transmitting/receiving module embedded therein. The multi input and multi output antenna apparatus 1 in accordance with the embodiment of the present disclosure is related to a MIMO (Multi Input Multi Output) wireless communication antenna system.

More specifically, the multi input and multi output antenna apparatus 1 in accordance with the embodiment of the present disclosure includes an antenna board 11 and a transmitting/receiving module board 110. The antenna board 11 includes a plurality of antenna elements 13 arranged on a front surface thereof, and the transmitting/receiving module board 110 includes a plurality of first heat generation elements arranged on a front surface thereof and a plurality of second heat generation elements arranged on a rear surface thereof, and is disposed to have a separation space from the antenna board 11. The first and second heat generation elements are electrically driven to generate heat.

In the following descriptions, the direction in which an antenna installation pillar to be described below is provided is defined as 'rear', and the direction in which a radome 5 is provided is defined as 'front', in order to prevent confusion about understandings of the present disclosure. Under the supposition that the multi input and multi output antenna apparatus 1 in accordance with the embodiment of the present disclosure is fixed to the antenna installation pillar, the directions will be defined and described. However, this is only in order to prevent confusion of convenience of description and understandings of the present disclosure, and the scope of the present disclosure is not limited thereto.

As illustrated in FIGS. 1 to 4, the antenna board 11 is housed in an antenna housing 10, such that the antenna elements 13 installed on the antenna board 11 are exposed to the front. The communication parts mounted on the antenna board 11 may include not only the plurality of antenna elements 13 but also an MBF (Multi-Band Filter).

The radome 5 may be disposed at the front of the antenna board 11 so as to cover the antenna board 11. The radome 5 may be formed of a material which wireless signals transmitted from or to the antenna elements 13 penetrate. For example, the radome 5 may be formed of insulating plastic.

In the multi input and multi output antenna apparatus 1 in accordance with the embodiment of the present disclosure, it will be defined and described that the radome 5 is provided at the front of the multi input and multi output antenna apparatus 1.

The radome 5 and the antenna housing 10 may have almost the same size. Specifically, the radome 5 and the antenna housing 10 may be formed at a ratio compared to the antenna board 11 housed in the antenna housing 10. Desirably, in the multi input and multi output antenna apparatus 1 in accordance with the embodiment of the present disclosure, the antenna board 11 may be formed in a rectangular shape having a horizontal length larger than a vertical length thereof, in order to remove installation interference with another antenna apparatus 1, which is already installed or is to be installed later, when the multi input and multi output antenna apparatus 1 is installed on the antenna installation pillar which will be additionally described below in 5G.

As illustrated in FIGS. 1 to 4, the multi input and multi output antenna apparatus 1 in accordance with the embodiment of the present disclosure includes an antenna assembly in which modules having the RF elements and the digital elements implemented therein are coupled through a stacked structure. Main modules of the antenna assembly may be divided into three layers.

The antenna board 11 serving as a first layer may be a PCB (Printed Circuit Board) on which a calibration network is implemented, and have the plurality of antenna elements 13 disposed on a front surface thereof and the plurality of MBFs mounted on a rear surface thereof.

The transmitting/receiving module board 110 serving as a second layer may be coupled to the first layer so as to have the above-described separation space therebetween. The transmitting/receiving module board 110 may have a plurality of RFICs 125 mounted on the front surface thereof and connected to the plurality of antenna elements 13. The plurality of communication parts including the plurality of RFICs 125, which are heat generation elements to generate a predetermined amount of heat when electrically operated, may be defined as 'a plurality of first heat generation elements'.

Furthermore, the transmitting/receiving module board 110 may include a plurality of FPGAs 115 mounted on the rear surface thereof, the plurality of FPGAs 115 performing a digital signal processing operation of receiving a converted digital signal from an analog/digital converter, and converting the received signal into a base band signal. The transmitting/receiving module board 110 includes analog processing circuits such as PAs (Power Amplifier), implemented on the rear surface thereof. The PAs included in the analog processing circuit may be electrically connected to the above-described MBFs through an RF interface. Furthermore, a digital processing circuit may be implemented on the rear surface of the transmitting/receiving module board 110, and a PSU (Power Supply Unit) may be mounted on the rear surface of the transmitting/receiving module board 110. The digital processing circuit performs a function of converting a digital signal received from a base station BBU (Base Band Unit) into an analog RF signal, and converting an analog RF signal received from an antenna into a digital signal and transmitting the digital signal to the base station BBU.

The plurality of FPGAs 115 and the PSU are heat generation elements to generate a predetermined amount of heat when electrically operated, like the plurality of first heat generation elements. Hereafter, the plurality of FPGAs 115 and the PSU may be defined as 'a plurality of second heat generation elements'.

In the multi input and multi output antenna apparatus 1 in accordance with the embodiment of the present disclosure, the antenna board 11 is designed in such a shape that the top-to-bottom width thereof is reduced. Thus, an additional antenna apparatus 1 may be easily installed in 5G.

In the multi input and multi output antenna apparatus 1 in accordance with the embodiment of the present disclosure, various communication parts integrated on the transmitting/receiving module board 110 are distributed and disposed on the front and rear surfaces thereof, in order to easily radiate heat. In this case, heat generated from the first heat generation elements provided on the front surface of the transmitting/receiving module board 110 is radiated to the front of the transmitting/receiving module board 110, and heat generated from the second heat generation elements provided on the rear surface of the transmitting/receiving module board 110 is radiated to the rear of the transmitting/receiving module board 110.

In particular, as described above, the antenna board 11 and the transmitting/receiving module board 110 may be disposed with the predetermined separation space provided therebetween, in order to minimize the influence of the heat, generated from the first heat generation elements on the front surface of the transmitting/receiving module board 110, on the antenna elements 13 disposed in front of the transmitting/receiving module board 110. Thus, the heat generated from the first heat generation elements may be radiated to the separation space.

Figure 5A:
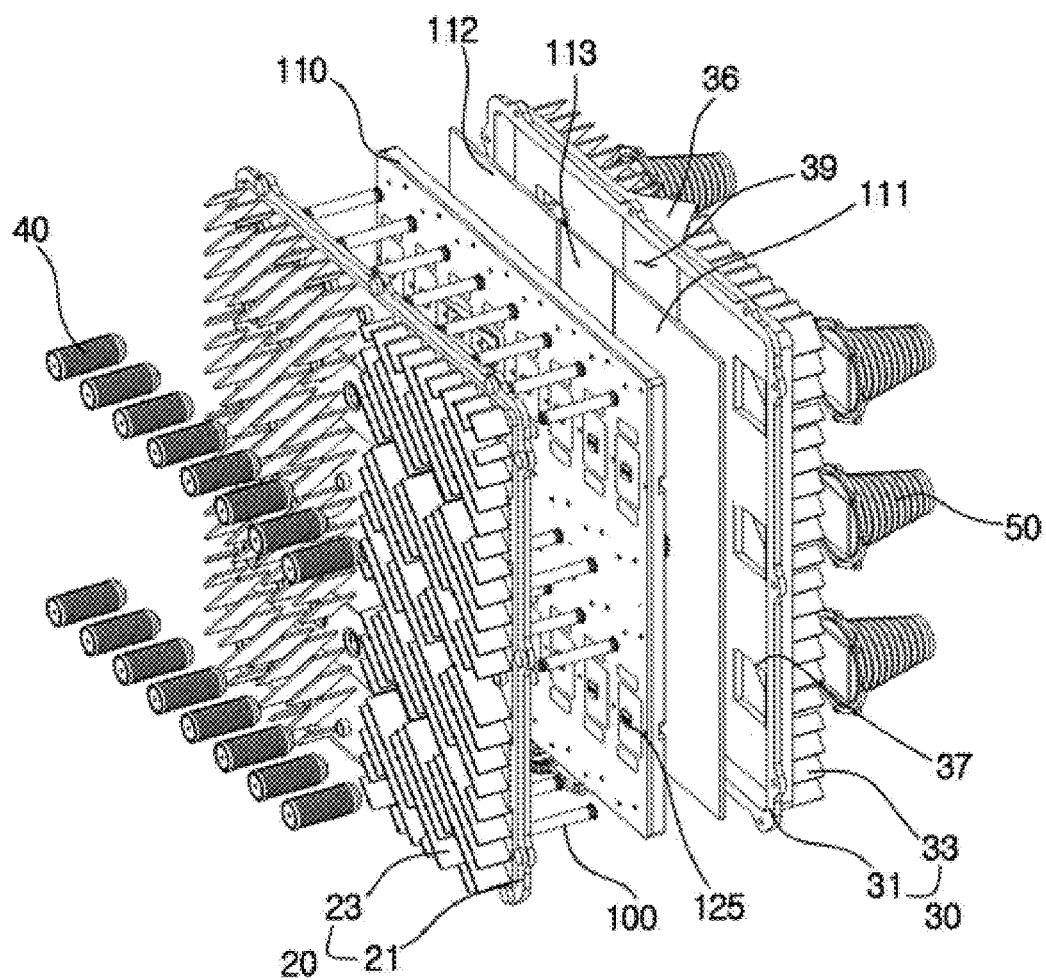
FIGS. 5A and 5B are front and rear exploded perspective views illustrating a one-side heat radiation unit and the other-side heat radiation unit among components of the multi input and multi output antenna apparatus in accordance with the embodiment of the present disclosure.
Figure 5B:
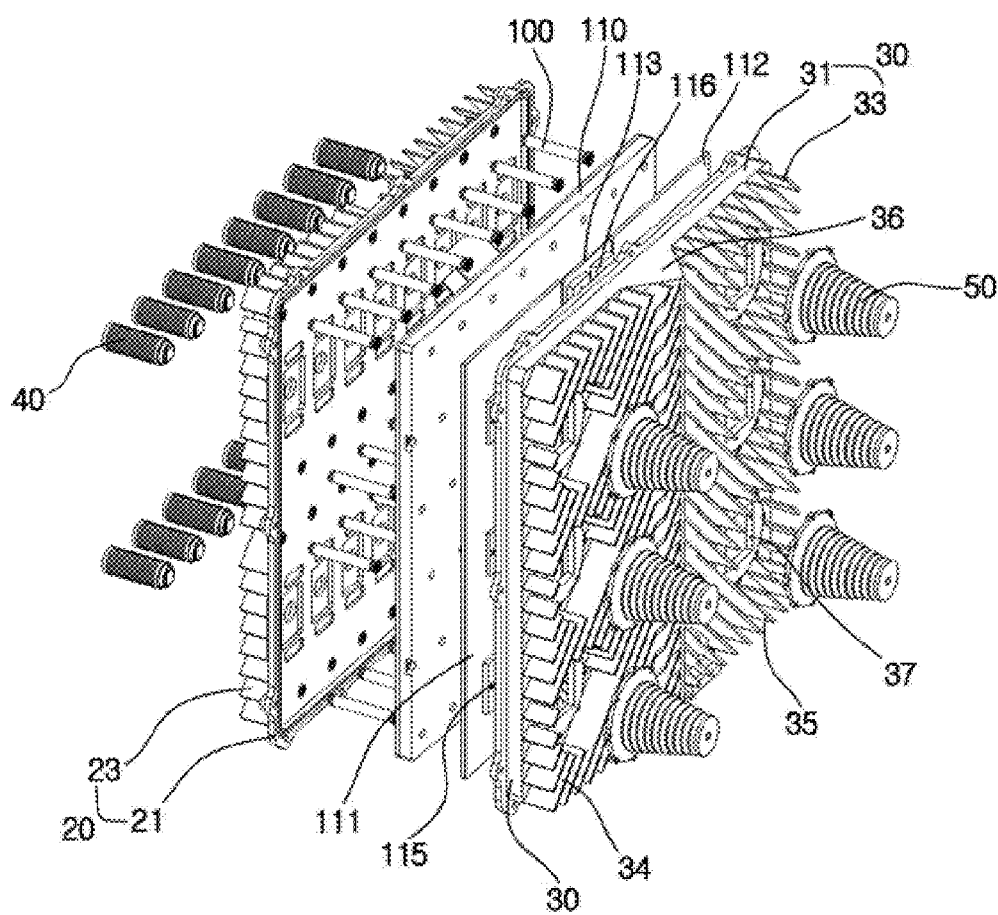
Figure 6:
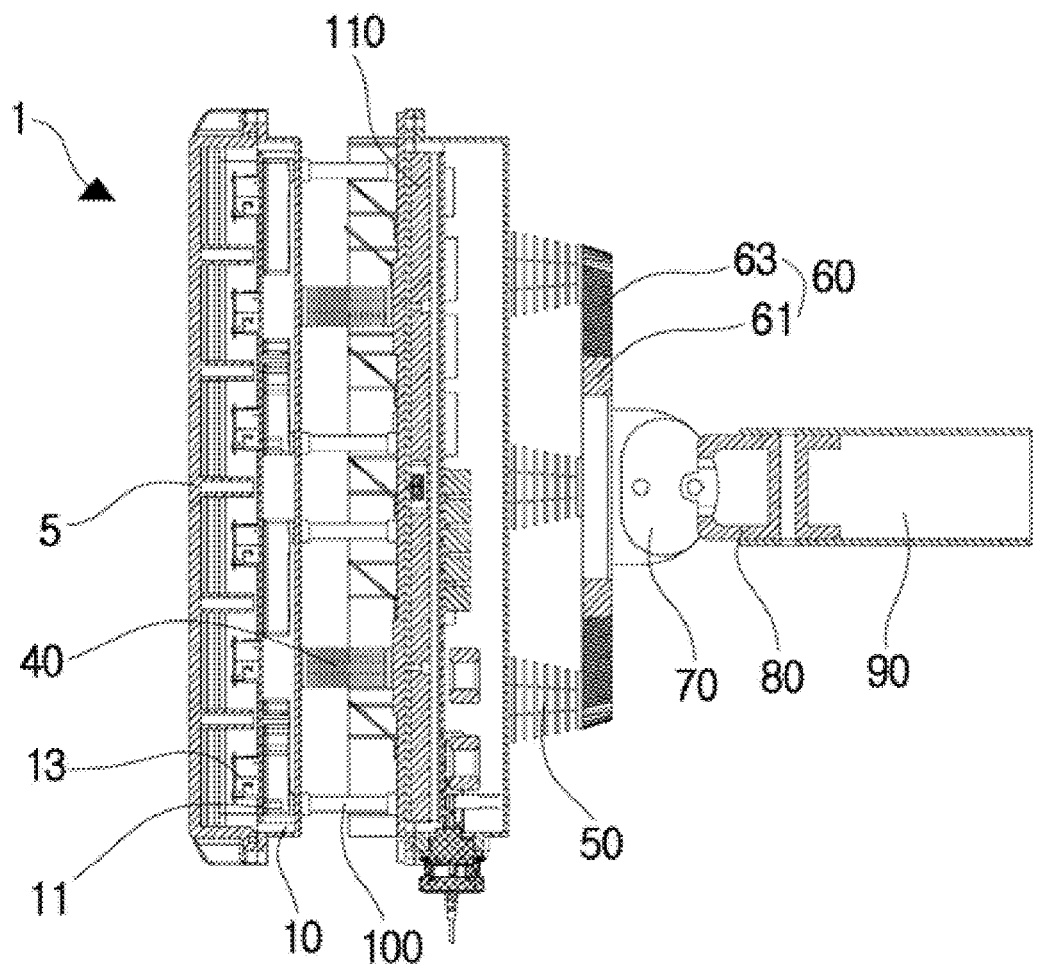
FIGS. 6 to 8 are cross-sectional views illustrating various portions in order to describe a state in which heat is radiated through the front and rear parts of the multi input and multi output antenna apparatus in accordance with the embodiment of the present disclosure.
Figure 7:
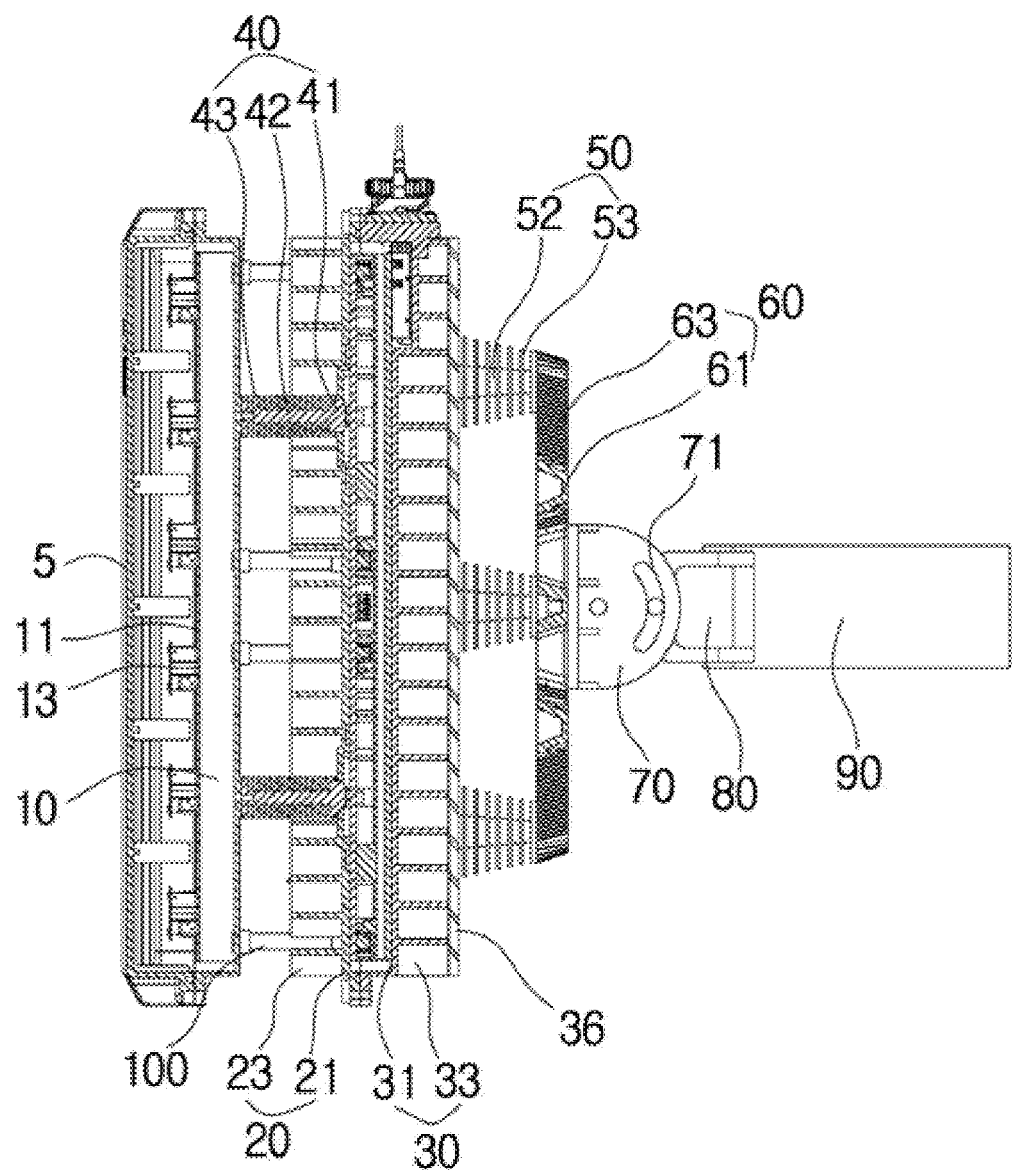
Figure 8:
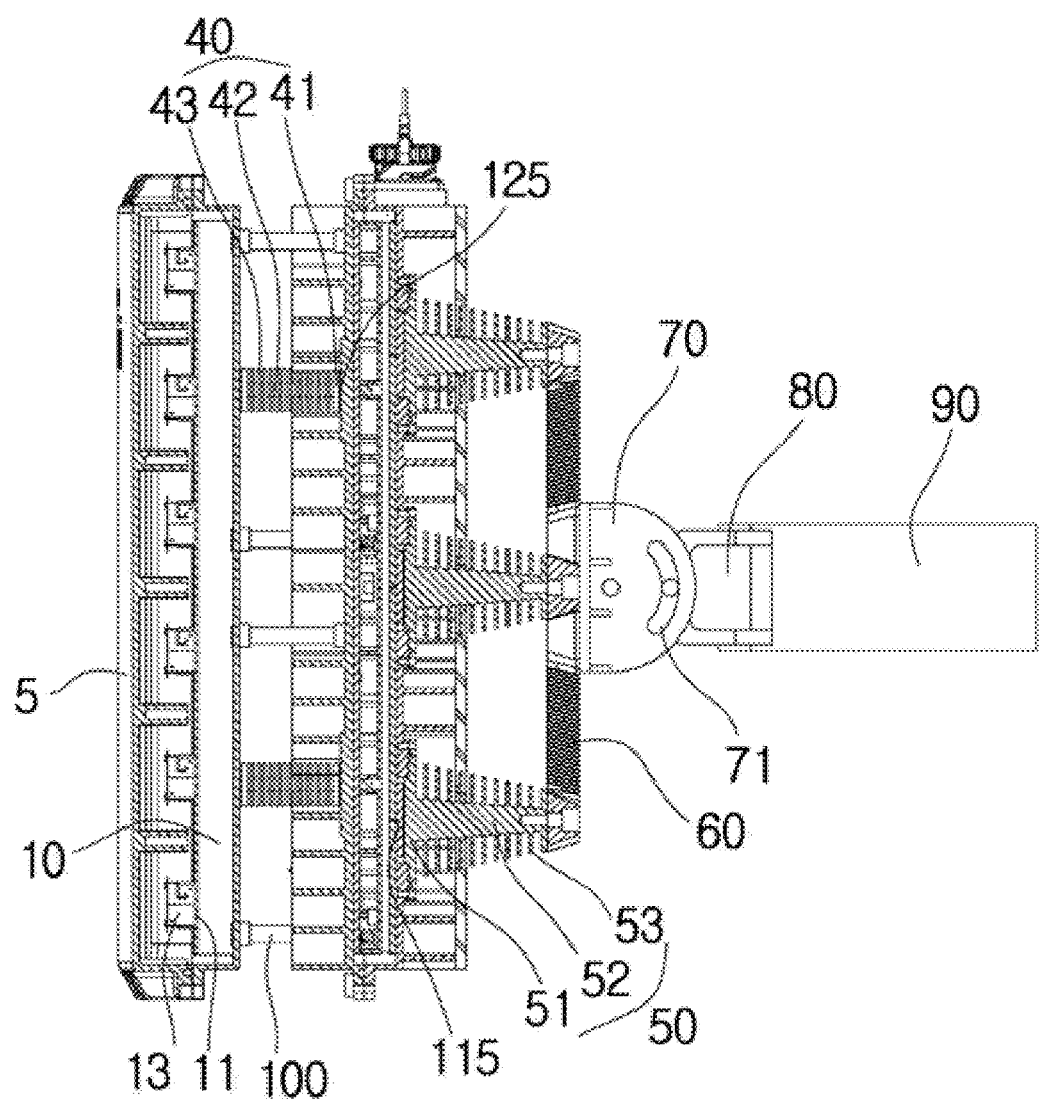

FIGS. 5A and 5B are front and rear exploded perspective views illustrating a one-side heat radiation unit and the other-side heat radiation unit among components of the multi input and multi output antenna apparatus in accordance with the embodiment of the present disclosure, FIG. 6 is a cross-sectional view taken along line A-A of FIG. 1, FIG. 7 is a cross-sectional view taken along line B-B of FIG. 1, and FIG. 8 is a cross-sectional view taken along line C-C of FIG. 1.

In the multi input and multi output antenna apparatus 1 in accordance with the embodiment of the present disclosure, the antenna board 11 and the transmitting/receiving module board 110 may be divided by a front heat radiation unit 20 disposed in the separation space, as illustrated in FIGS. 5A and 5B. The front heat radiation unit 20 may be formed of a metallic material. When the front heat radiation unit 20 is formed of a metallic material, it is possible to minimize the influence of electromagnetic waves between the plurality of communication parts provided on the transmitting/receiving module board 110 and the plurality of antenna elements 13 disposed on the antenna board 11 in front of the transmitting/receiving module board 110.

In the multi input and multi output antenna apparatus 1 in accordance with the embodiment of the present disclosure, a rear heat radiation unit 30 may be disposed outside the transmitting/receiving module board 110 so as to cover the transmitting/receiving module board 110, as illustrated in FIGS. 5A and 5B. Therefore, the front heat radiation unit 20 may be disposed in contact with the first heat generation elements provided on the front surface of the transmitting/receiving module board 110, and the rear heat radiation unit 30 may be disposed in contact with the second heat generation elements provided on the rear surface of the transmitting/receiving module board 110.

The front heat radiation unit 20 may be disposed in the separation space. The front heat radiation unit 20 may be disposed in the separation space so as to fill the separation space between the antenna board 11 and the transmitting/receiving module board 110. However, when the front heat radiation unit 20 fills the entire separation space, the introduction of external air, which may take part in heat radiation of the front heat radiation unit 20, may be blocked to reduce the heat radiation performance. Thus, the front end of the front heat radiation unit 20 and the antenna housing 10 in which the antenna board 11 is housed may be spaced to some extent apart from each other.

The rear heat radiation unit 30 may be disposed in an outer space around the transmitting/receiving module board 110, facing the separation space. That is, the rear heat radiation unit 30 may be disposed to completely cover the other surface of the transmitting/receiving module board 110.

As illustrated in FIGS. 5A and 7, the front heat radiation unit 20 may include a front heat radiation body 21 and a plurality of front unit heat radiation bodies 40. The front heat radiation body 21 may be disposed in contact with the front surface of the transmitting/receiving module board 110 and include a plurality of main heat radiation pins 23 protruding to the front thereof. The plurality of front unit heat radiation bodies 40 may be disposed through the front heat radiation body 21, and have one ends contacted with at least some of the first heat generation elements of the transmitting/receiving module board 110 and the other ends on which a plurality of sub heat radiation pins 43 for radiating heat conducted from the first heat radiation elements to the outside are provided.

Hereafter, 'the main heat radiation pins' provided on the front heat radiation body 21 are referred to as the front main heat radiation pins 23', and 'the sub heat radiation pins' provided on the front unit heat radiation body 40 are referred to as 'the front sub heat radiation pins 43', in order to distinguish the heat radiation pins from components of the rear heat radiation unit 30, which will be described below.

The plurality of front main heat radiation pins 23 serve to radiate heat transferred from the first heat generation elements to the front heat radiation body 21 by exchanging the heat with external air introduced from the outside. Therefore, the front heat radiation body 21 may be formed of a metallic material which easily conducts heat, and the plurality of front main heat radiation pins 23 may also be formed of a metallic material which can easily conducts heat.

The plurality of front main heat radiation pins 23 may be formed on the front surface of the front heat radiation body 21. For example, the plurality of front main heat radiation pins 23 may be formed as one body with the front heat radiation body 21. However, the present disclosure is not limited thereto, and the plurality of front main heat radiation pins 23 may be manufactured as separate members, and bonded to the front surface of the front heat radiation body 21 through a thermally conductive adhesive, or fixed through a separate fastening member such as a bolt.

The plurality of front unit heat radiation bodies 40 serve to radiate heat to the above-described separation space, separately from the front heat radiation body 21 which radiates heat generated from the RFICs 125 connected to the plurality of first heat generation elements, or specifically the plurality of antenna elements 13 which will be described below.

The multi input and multi output antenna apparatus 1 in accordance with the embodiment of the present disclosure adopts a structure that separately radiates heat generated from the RFICs 125 among the communication parts which generate a large amount of heat among the first heat generation elements. Thus, regardless of the heat radiation performance of the front heat radiation body 21, the heat generated from the plurality of RFICs 125 may be more quickly radiated.

The plurality of front main heat radiation pins 23 formed on the front surface of the front heat radiation body 21 may be disposed so as to be inclined upward. That is, as the multi input and multi output antenna apparatus 1 in accordance with the embodiment of the present disclosure is disposed in the top-to-bottom direction in FIGS. 5A and 5B, the plurality of front main heat radiation pins 23 may be formed to have an air flow path in the top-to-bottom direction, such that external air is easily introduced into the separation space. Furthermore, in the multi input and multi output antenna apparatus 1 in accordance with the embodiment of the present disclosure, the plurality of front main heat radiation pins 23 are inclined upward to further increase the amount of external air introduced into the separation space. Thus, the external air may be easily introduced through the side portions as well as the bottom portion of the front heat radiation body 21.

The plurality of front main heat radiation pins 23 may include a left heat radiation pin part inclined upward toward the top-to-bottom center line of the front heat radiation body 21 from the left side in FIG. 5A, and a right heat radiation pin part inclined upward toward the top-to-bottom center line of the front heat radiation body 21 from the right side in FIG. 5A.

That is, the plurality of front main heat radiation pins 23 may be divided into two groups, i.e. the left heat radiation pin part and the right heat radiation pin part, such that the external air is introduced through the left heat radiation pin part from the left side of the front heat radiation body 21 and flows upward toward the middle of the front surface of the front heat radiation body 21, and the external air is introduced through the right heat radiation pin part from the right side of the front heat radiation body 21 and flows upward toward the middle of the front surface of the front heat radiation body 21.

The heat-exchanged air gathering in the middle of the front surface of the front heat radiation body 21 from both sides thereof may be discharged upward to the space between the left heat radiation pin part and the right heat radiation pin part.

As illustrated in FIG. 7, one ends of the plurality of front unit heat radiation bodies 40 may be fixed to the front heat radiation body 21, and the other ends of the plurality of front unit heat radiation bodies 40 may be fixed to the rear surface of the antenna housing 10 in which the antenna board 11 is housed.

More specifically, each of the front unit heat radiation bodies 40 may include a coupling part 41, a conduction part 42 and the plurality of sub heat radiation pins 43. The coupling part 41 serving as the one end is coupled to the front heat radiation body 21 so as to be contacted with any one of the first heat generation elements, the conduction part 42 transfers heat, conducted through the coupling part 41, to the separation space, and the plurality of sub heat radiation pins 43 are stacked on the outer circumference of the conduction part 42 so as to be spaced part from each other. The leading end of the conduction part 42, serving as the other end, may be fixed to the rear surface of the antenna housing 10.

The plurality of front sub heat radiation pins 43 may have the same heat radiation area. This is because, since some of the plurality of front sub heat radiation pins 43 may be disposed to cover or overlap the plurality of front main heat radiation pins 23 when the front sub heat radiation pins 43 have different heat radiation areas, the heat radiation performance is not significantly increased.

The plurality of front sub heat radiation pins 43 of the front unit heat radiation bodies 40 may be exposed to the separation space. That is, the front-to-rear lengths of the plurality of front unit heat radiation bodies 40 may be set to such a value that the one ends of the front unit heat radiation bodies 40 are coupled to the front heat radiation body 21 and the other ends of the front unit heat radiation bodies 40 further protrude to the separation space than the plurality of front main heat radiation pins 23 formed on the front heat radiation body 21. As parts of the plurality of front unit heat radiation bodies 40 are exposed to the separation space between ends of the plurality of front main heat radiation pins 23 and the antenna housing 10, heat may be more quickly radiated.

The front heat radiation body 21 may have coupling holes (not illustrated) to which the coupling parts 41 of the front unit heat radiation bodies 40 are coupled. The coupling parts 41 of the plurality of front unit heat radiation bodies 40 may be disposed in contact with a heat generation surface of at least any one of the first heat generation elements through the coupling holes 37 of the front heat radiation bodies 21. At this time, the coupling part 41 may be coupled to the coupling hole through a screwing method.

However, the coupling between the front heat radiation body 21 and the front unit heat radiation bodies 40 is not limited to the screwing method. That is, although not illustrated, the plurality of front unit heat radiation bodies 40 may be coupled through a simple rotation coupling method in which the coupling parts 41 of the plurality of front unit heat radiation bodies 40 have male screw threads formed on outer circumferential surfaces thereof and the coupling holes 37 of the front heat radiation bodies 21 have female screw threads formed on inner circumferential surfaces thereof, as long as the plurality of front unit heat radiation bodies 40 are coupled so as to be contacted with the heat generation surfaces of the first heat generation elements.

Figure 9A:
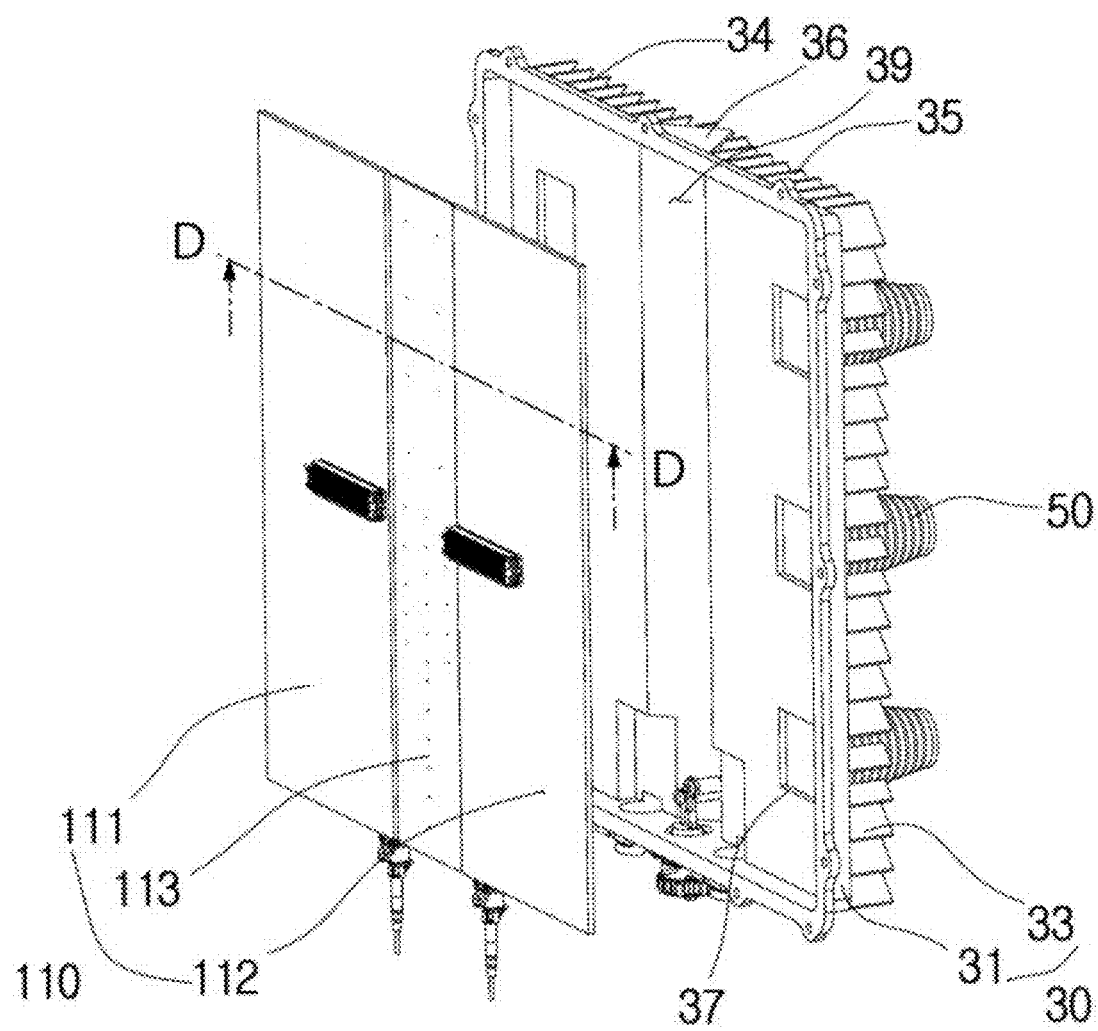
FIGS. 9A and 9B are front and rear exploded perspective views illustrating a BB board and a heat radiation structure thereof among the components of the multi input and multi output antenna apparatus in accordance with the embodiment of the present disclosure.
Figure 9B:
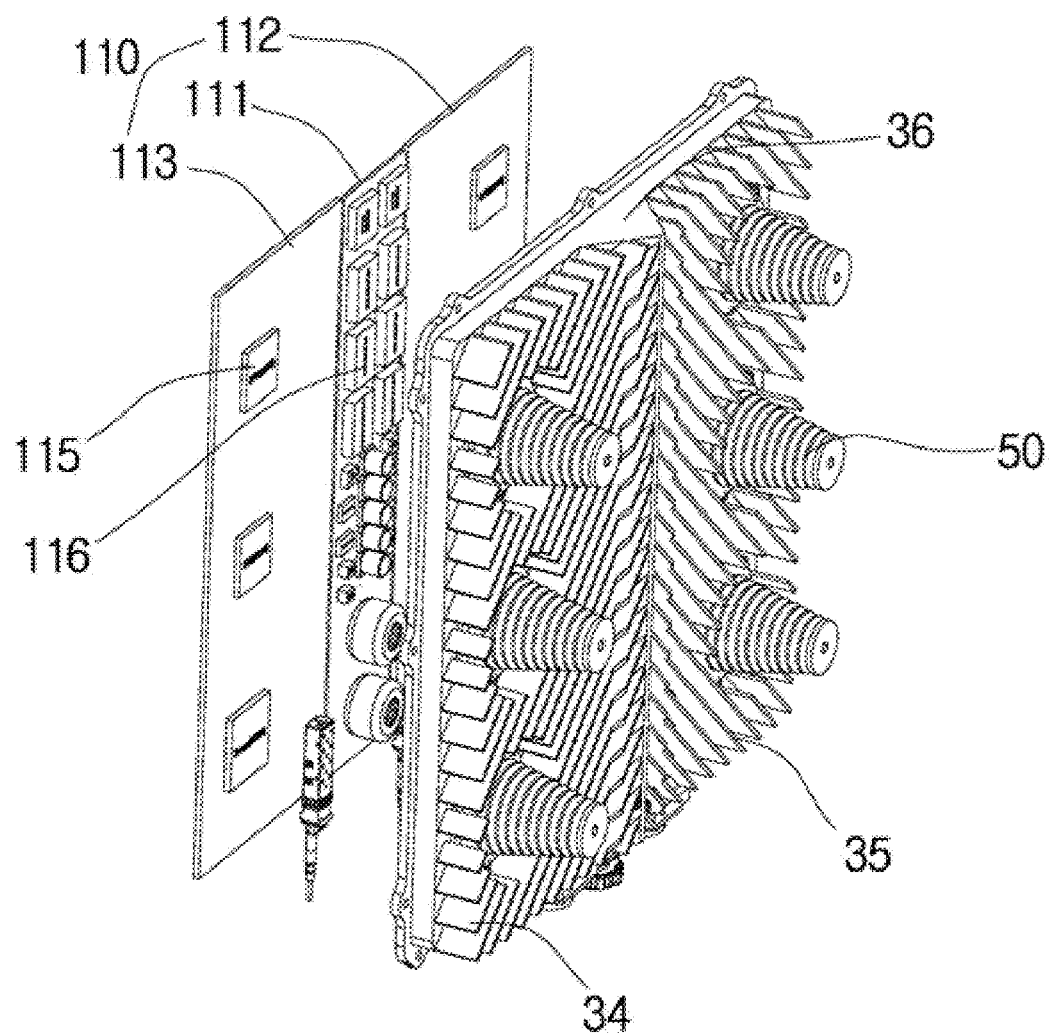
Figure 10:
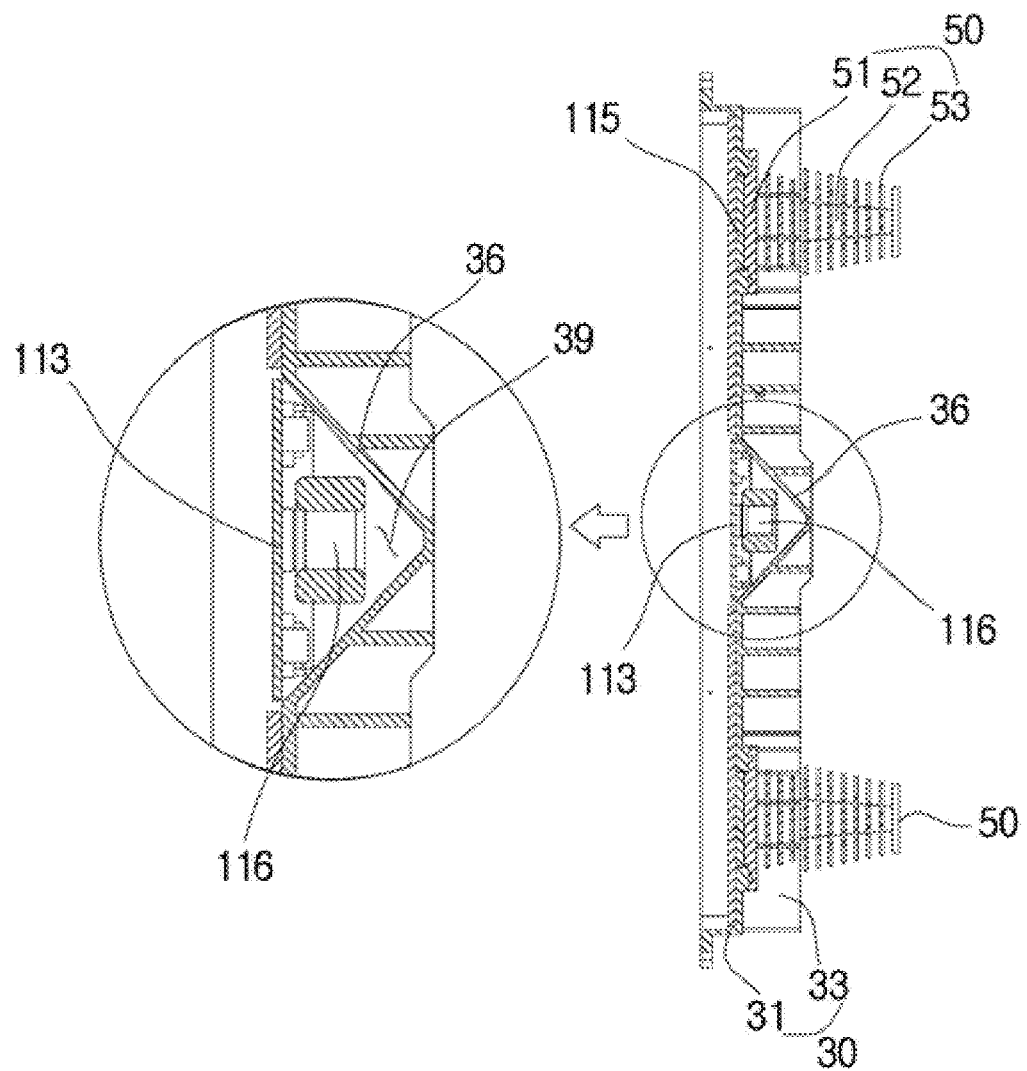
FIG. 10 is a cross-sectional view taken along the line D-D in the state of FIG. 9A and a partially expanded view thereof.

FIGS. 9A and 9B are front and rear exploded perspective views illustrating a BB board and a heat radiation structure thereof, among the components of the multi input and multi output antenna apparatus in accordance with the embodiment of the present disclosure, and FIG. 10 is a cross-sectional view taken along D-D line in the state of FIG. 9A, including an expanded view of a portion of the BB board.

In the multi input and multi output antenna apparatus 1 in accordance with the embodiment of the present disclosure, the rear surface of the transmitting/receiving module board 110 may be covered by the rear heat radiation unit 30, as illustrated in FIGS. 5A and 5B. That is, the rear heat radiation unit 30 serves to protect the transmitting/receiving module board 110 from external pollutants by shielding the rear surface of the transmitting/receiving module board 110.

The rear heat radiation unit 30 may be formed of a metallic material having excellent heat conductivity. However, the material of the rear heat radiation unit 30 is not particularly limited as long as the material has excellent heat conductivity.

As described above, the transmitting/receiving module board 110 may be provided so that heat generated from the first heat generation elements provided on the front surface thereof is radiated to the separation space by the front heat radiation unit 20, and heat generated from the second heat generation elements provided on the rear surface thereof is radiated to the outer space by the rear heat radiation unit 30.

As illustrated in FIGS. 5B and 8, the rear heat radiation unit 30 may include a rear heat radiation body 31 and a plurality of rear unit heat radiation bodies 50. The rear heat radiation body 31 may be disposed in contact with the rear surface of the transmitting/receiving module board 110, and have a plurality of main heat radiation pins protruding to the rear thereof, and the plurality of rear unit heat radiation bodies 50 may be disposed through the rear heat radiation body 31, and have one ends contacted with at least some of the second heat generation elements of the transmitting/receiving module board 110 and the other ends on which a plurality of sub heat radiation pins for radiating heat conducted from the second heat generation elements to the outside are provided. The plurality of main heat radiation pins are referred to as 'rear main heat radiation pins 33' in order to distinguish from 'the front main heat radiation pins' of the front heat radiation unit 20, and the plurality of sub heat radiation pins are referred to as 'rear sub heat radiation pins 53' in order to distinguish from 'the front sub heat radiation pins 43' of the front heat radiation unit 20.

The plurality of rear main heat radiation pins 33 serve to radiate heat, transferred from the second heat generation elements to the rear heat radiation body 31, by exchanging the heat with external air. Therefore, like the front heat radiation body 21, the rear heat radiation body 31 may be formed of a metallic material which easily conducts heat, and the plurality of rear main heat radiation pins 33 may also be formed of a metallic material which easily conducts heat.

The plurality of rear main heat radiation pins 33 may be formed on the rear surface of the rear heat radiation body 31. For example, the plurality of rear main heat radiation pins 33 may be formed as one body with the rear heat radiation body 31, or manufactured as separate members and bonded to the rear surface of the rear heat radiation body 31 through a thermally conductive adhesive or fixed through a separate fastening member such as a bolt.

As will be described below, the plurality of rear unit heat radiation bodies 50 serve to radiate heat from the plurality of second heat generation elements to the outer space, separately from the rear heat radiation body 31.

The multi input and multi output antenna apparatus 1 in accordance with the embodiment of the present disclosure adopts a structure which separately radiates heat generated from the plurality of FPGAs 115 among the communication parts which generate a large amount of heat among the second heat generation elements. The plurality of FPGAs 115 serve to perform a digital signal processing operation of receiving a converted digital signal from an analog/digital converter, and converting the received signal into a base band signal. Thus, regardless of the heat radiation performance of the rear heat radiation body 31, heat generated from the plurality of RFICs 125, which generates a relatively large amount of heat, may be more quickly radiated.

The plurality of rear main heat radiation pins 33 formed on the rear surface of the rear heat radiation body 31 may be disposed so as to be inclined upward, like the plurality of front main heat radiation pins 23. In the multi input and multi output antenna apparatus 1 in accordance with the embodiment of the present disclosure, the plurality of rear main heat radiation pins 33 may be inclined upward to further increase the amount of external air introduced into the plurality of rear main heat radiation pins 33. Therefore, the external air may be easily introduced through the side portions as well as the bottom portion of the rear heat radiation body 31.

The plurality of rear main heat radiation pins 33 may include a left heat radiation pin part 34 inclined upward toward the top-to-bottom center line of the rear heat radiation body 31 from the left side of FIG. 5B, and a right heat radiation pin part 35 inclined upward toward the top-to-bottom center line of the rear heat radiation body 31 from the right side of FIG. 5B.

That is, the plurality of rear main heat radiation pins may be divided into two groups, i.e. the left heat radiation pin part 34 and the right heat radiation pin part 35, such that the external air is introduced through the left heat radiation pin part 34 from the left side of the rear heat radiation body 31 and flows upward toward the middle of the front surface of the rear heat radiation body 31, and the external air is introduced through the right heat radiation pin part 35 from the right side of the rear heat radiation body 31 and flows upward toward the middle of the front surface of the rear heat radiation body 31.

The heat-exchanged air gathering in the middle of the front surface of the rear heat radiation body 31 from both sides thereof may be discharged to the outer space from a heat radiation exhaust rib 36 where the left heat radiation pin part 34 and the right heat radiation pin part 35 meet each other and which will be described below.

As illustrated in FIGS. 5B and 8, the plurality of rear unit heat radiation bodies 50 may have one ends fixed to the rear heat radiation body 31 and the other ends coupled to an antenna installation bracket which will be described below.

More specifically, each of the rear unit heat radiation bodies 50 may include a coupling part 51, a conduction part 52 and the plurality of rear sub heat radiation pins 53. The coupling part 51 serving as the one end is coupled to the rear surface of the rear heat radiation body 31 so as to be contacted with any one of the second heat generation elements, the conduction part 52 transfers heat conducted through the coupling part 51 to the outer space, and the plurality of rear sub heat radiation pins 53 are stacked on the outer circumference of the conduction part 52 so as to be spaced part from each other. The leading end of the conduction part 52, serving as the other end, may be fixed to the antenna installation bracket.

The plurality of rear sub heat radiation pins 53 may have a heat radiation area that gradually decreases toward the outer space. This is in order to design the multi input and multi output antenna apparatus 1 such that the rear sub heat radiation pin 53 close to the rear heat radiation body 31, i.e. the second heat generation element has a larger area than the rear sub heat radiation pin 53 remote from the rear heat radiation body 31, thereby more quickly radiating heat conducted from the second heat generation element.

Furthermore, the plurality of rear unit heat radiation bodies 50 may be formed to further protrude to the outer space than the plurality of rear main heat radiation pins 33 formed on the rear heat radiation body 31. This is in order to prevent installation interference by the rear main heat radiation pin 33 when the rear unit heat radiation bodies are coupled to the antenna installation bracket which will be described below.

The rear heat radiation body 31 may have coupling holes 37 to which the coupling parts 51 of the plurality of rear unit heat radiation bodies 50 are coupled. The coupling parts 51 of the plurality of rear unit heat radiation bodies 50 may be disposed in contact with a heat radiation surface of at least any one of the second heat generation elements through the coupling holes 37 of the rear heat radiation bodies 31. At this time, the coupling part 51 may be coupled to the coupling hole 37 through a screwing method.

In the multi input and multi output antenna apparatus 1 in accordance with the embodiment of the present disclosure, the transmitting/receiving module board 110 may include a first transmitting/receiving board 111, a second transmitting/ receiving board 112 and a third transmitting/receiving board 113, as illustrated in FIGS. 9A, 9B and 10. The first transmitting/receiving board 111 has some of the plurality of second heat generation elements mounted thereon, and is elongated in the top-to-bottom direction on the left side of the rear heat radiation unit 30. The second transmitting/receiving board 112 has some of the plurality of second heat generation elements mounted thereon and is elongated in the top-to-bottom direction on the right side of the rear heat radiation unit 30. The third transmitting/receiving board 113 has the others of the plurality of second heat generation elements mounted thereon and is elongated in the top-to-bottom direction between the first and second transmitting/receiving boards 111 and 112.

Each of the first and second transmitting/receiving boards 111 and 112 may include the plurality of FPGAs 115 spaced a predetermined distance apart from each other in the top-to-bottom direction. Therefore, the number of the rear unit heat radiation bodies 50 coupled to the outside of the rear heat radiation body 31 may correspond to the number of the FPGAs 115.

On the third transmitting/receiving board 113, the other communication parts 116 excluding the communication parts such as the FPGA 115, which generate a relatively large amount of heat, may be mounted. However, only the FPGAs 115 are not necessarily provided on the first and second transmitting/receiving boards 111 and 112, or the FPGAs 115 may be provided on the third transmitting/receiving board 113. That is, the FPGAs 115 and the other communication parts 116 excluding the FPGAs 115 may be distributed and disposed on the first to third transmitting/receiving boards 111 to 113 in consideration of heat radiation.

In the multi input and multi output antenna apparatus 1 in accordance with the embodiment of the present disclosure, the heat generated from the FPGAs 115, which generate a relatively large amount of heat, may be individually radiated by the rear unit heat radiation bodies 50. Furthermore, it is not easy to bring the other communication parts 116 excluding the FPGAs 115 into direct contact with the rear heat radiation bodies 31 because the other communication parts 116 have various heights from the board surface and are formed in various shapes. Therefore, the other communication parts 116 are concentrated and disposed on the rear surface of the third transmitting/receiving board 113, and the other communication parts 116 excluding the FPGAs 115 are seated in a seating groove 39 formed on the rear heat radiation body 31. The seating groove 39 will be described below.

More specifically, as illustrated in FIG. 9A, the rear heat radiation body 31 may have the seating groove 39 elongated in the top-to-bottom direction, such that the plurality of second heat generation elements of the third transmitting/receiving board 113 are seated in the seating groove 39.

The seating groove 39 may be recessed from the front surface toward the rear surface of the rear heat radiation body 31. Therefore, as illustrated in FIGS. 9A and 9B, the heat radiation exhaust rib 36 may be formed on the outer surface (rear surface) of the rear heat radiation body 31, on which the plurality of rear main heat radiation pins 33 are formed, and protrude from the inner surface toward the outer surface of the rear heat radiation body 31, such that the seating groove 39 is formed in a recess shape. The shape and specific function of the heat radiation exhaust rib 36 will be described below in detail.

As described above, heat generated from some of the plurality of second heat generation elements seated in the seating groove 39 may be collected in the seating groove 39, and radiated to the outside through the heat radiation exhaust rib 36 of the rear heat radiation body 31 or the plurality of rear main heat radiation pins 33 connected to the heat radiation exhaust rib 36.

The heat radiation exhaust rib 36 may be formed to have a horizontal cross-section having vertices of a triangle. The plurality of rear main heat radiation pins 33 may be extended to the vertices of the heat radiation exhaust rib 36. More specifically, the top of the left heat radiation pin part 34 of the rear main heat radiation pins 33 is extended to the heat radiation exhaust rib 36, and the top of the right heat radiation pin part 35 of the rear main heat radiation pins 33 is extended to the heat radiation exhaust rib 36.

When it is assumed that the height of the heat radiation exhaust rib 36 protruding to the outside of the rear heat radiation body 31 is equal to the height of the rear main heat radiation pin 33, heat radiation air flowing between the rear main heat radiation pins 33 may meet the heat radiation exhaust rib 36 while moving upward, and the heat radiation air having met the heat radiation exhaust rib 36 may be easily exhausted to the outer space while flowing toward the vertices of the triangle.

As illustrated in FIGS. 5A and 5B, the multi input and multi output antenna apparatus 1 in accordance with the embodiment of the present disclosure may further include a plurality of RF air lines 100 which connect the communication parts including the plurality of antenna elements 13 of the antenna board 11 and the first heat generation elements of the transmitting/receiving module board 110.

The plurality of RF air lines 110 may have one ends connected to the rear surface of the antenna housing 10 and the other ends connected to the front surface of the front heat radiation body 21. Through the plurality of RF air lines 100, power supply lines may be constructed between the communication parts including the antenna elements 13 of the antenna board 11 and the communication parts including the RFICs 125 and the FPGAs 115 of the transmitting/receiving module board 110.

Figure 11:
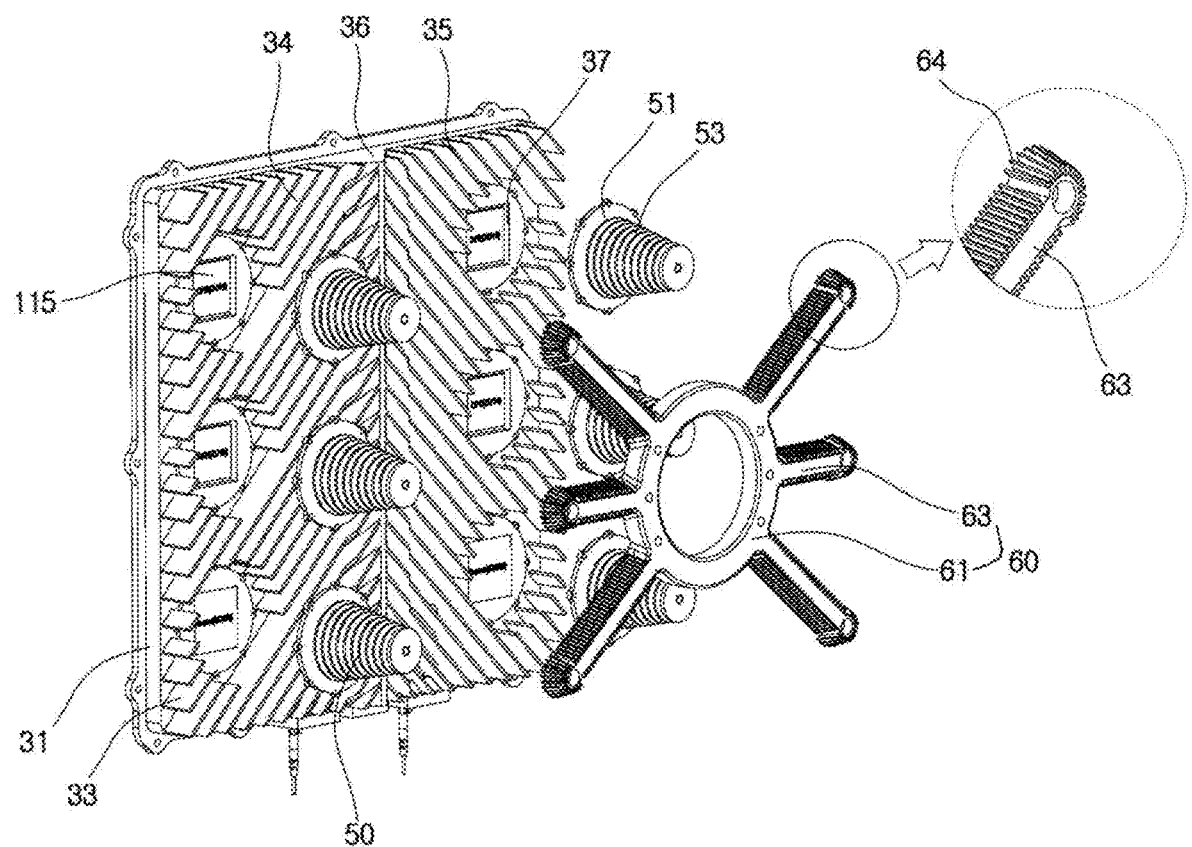
FIG. 11 is an exploded perspective view illustrating that an installation bracket among the components of FIG. 1 is coupled.
Figure 12A:
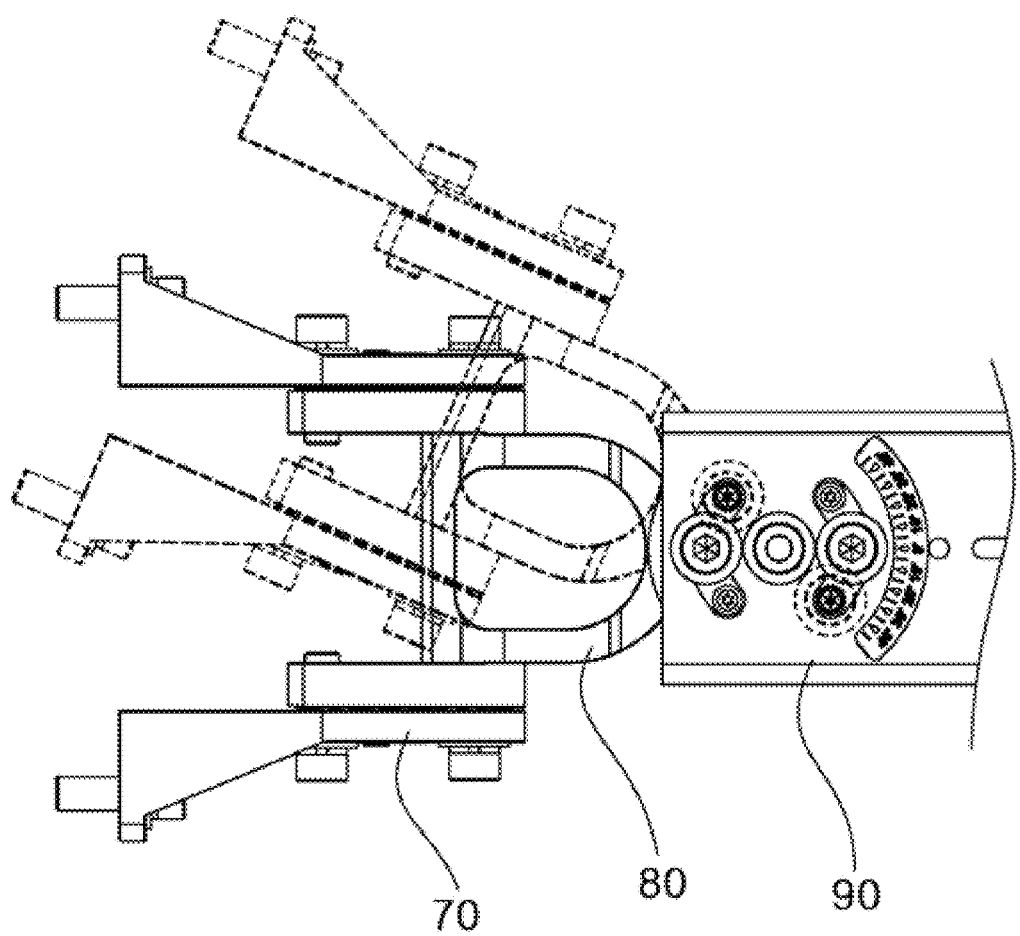
FIGS. 12A and 12B are plan and side views illustrating rotating and tilting operations by a horizontal rotating bracket and a vertical rotating bracket among the components of the installation bracket.
Figure 12B:
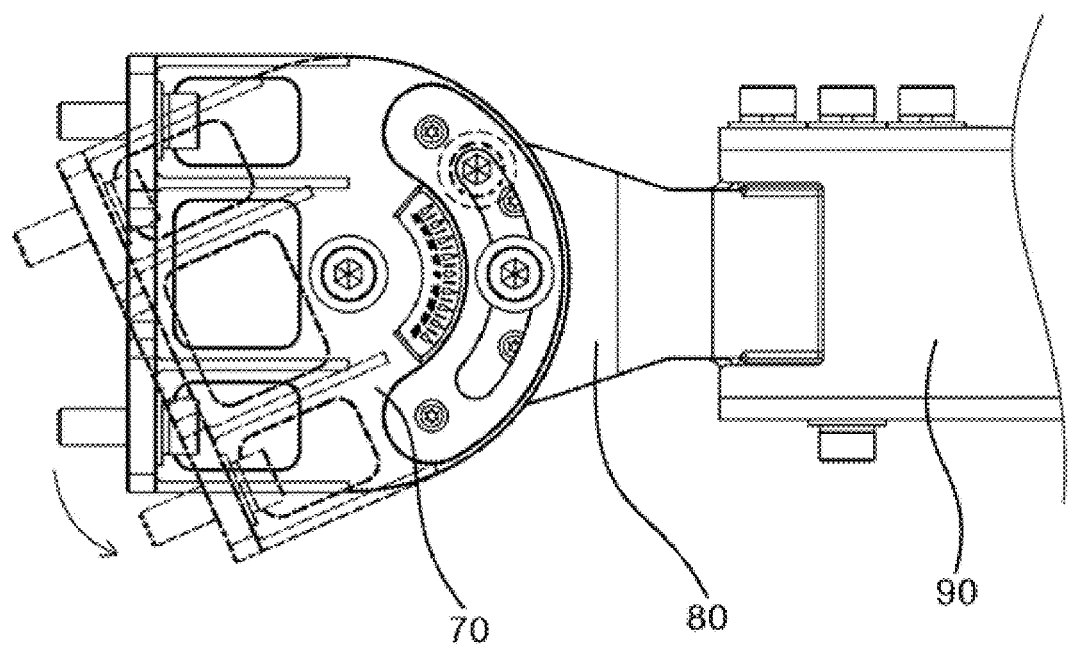

FIG. 11 is an exploded perspective view illustrating that the installation bracket among the components of FIG. 1 is coupled, and FIGS. 12A and 12B are plan and side views illustrating rotating and tilting operations by a horizontal rotating bracket and a vertical rotating bracket among the components of the installation bracket.

As illustrated in FIGS. 1 to 4 and 11, the multi input and multi output antenna apparatus 1 in accordance with the embodiment of the present disclosure may further include the installation bracket through which the multi input and multi output antenna apparatus 1 is installed on an existing antenna installation pillar.

As illustrated in FIGS. 1 to 4, the installation bracket includes a heat radiation bracket 60, a vertical rotating bracket 70, a horizontal rotating bracket 80 and a pillar fixing bracket 90. The heat radiation bracket 60 is coupled to the plurality of rear unit heat radiation bodies 50. The vertical rotating bracket 70 is coupled to the heat radiation bracket 60, and provided to vertically rotate with respect to a fixed point of the antenna installation pillar. The horizontal rotating bracket 80 is coupled to the vertical rotating bracket 70, and provided to horizontally rotate with respect to the fixed point of the antenna installation pillar. The pillar fixing bracket 90 has one end coupled to the horizontal rotating bracket 80 and the other end coupled to the antenna installation pillar.

In general, when the antenna apparatus 1 elongated in the top-to-bottom direction, as the antenna apparatus 1 compared to the embodiment of the present disclosure, is installed in the longitudinal direction on the antenna installation pillar, it is substantially impossible to maintain the balance of the antenna apparatus 1 fixed to one installation pillar, due to the entire shape of the product elongated in the top-to-bottom direction.

Furthermore, after the antenna apparatus 1 is installed on the antenna installation pillar, the angle of the antenna apparatus 1 needs to be adjusted in order to control the direction of waves emitted to/from the antenna element 13. However, when the antenna apparatus 1 elongated in the top-to-bottom direction is fixed only through one installation bracket, the pressure of external wind inevitably causes the upper end or lower end of the antenna apparatus 1 to physically shake. Therefore, in general, the antenna installation pillar of the antenna apparatus 1 needs to be fixed to the antenna installation pillar through an installation bracket with a complex structure.

As illustrated in FIGS. 1 to 4 and 11, however, the installation bracket applied to the multi input and multi output antenna apparatus 1 in accordance with the embodiment of the present disclosure may be provided in a cantilever shape on the antenna installation pillar (not illustrated), in order to fix the antenna apparatus 1

Furthermore, the vertical rotating bracket 70, the horizontal rotating bracket 80 and the pillar fixing bracket 90 of the installation bracket may be rotatably provided to adjust the angle of the antenna apparatus 1.

After the antenna apparatus 1 is installed at the leading end of the vertical rotating bracket 70 through the heat radiation bracket 60, the angle of the antenna apparatus 1 can be adjusted in the horizontal direction through an operation of rotating the horizontal rotating bracket 80 in the side-to-side direction as illustrated in FIG. 12A, and can be adjusted in the vertical direction through an operation of rotating the vertical rotating bracket 70 in the top-to-bottom direction with respect to the horizontal rotating bracket 80, as illustrated in FIG. 12B.

As illustrated in FIG. 11, the heat radiation bracket 60 may include an installation ring part 61 formed in a ring shape to provide an installation surface of the vertical rotating bracket 70, and a plurality of fixing parts 63 extended radially from the outer surface of the installation ring part 61 and extended toward the plurality of rear unit heat radiation bodies 50.

When the plurality of fixing parts 63 are coupled to the rear heat radiation body 31, the installation ring part 61 may be located in the middle of the rear surface of the rear heat radiation body 31 in order to balance the entire weight of the antenna apparatus 1.

As illustrated in the expanded view of FIG. 11, a plurality of residual heat radiation pins 64 may be formed on the outer surface of the fixing part 63 so as to radiate heat transferred from the plurality of rear unit heat radiation bodies 50.

The plurality of residual heat radiation pins 64 may increase the surface areas of the plurality of fixing parts 63, thereby effectively radiating the heat of the rear unit heat radiation body 50, transferred to the second heat generation elements.

The vertical rotating bracket 70 may have a vertical guide slot 71 for guiding the rotation in the top-to-bottom direction. The vertical guide slot 71 serves to connect the front ends of the horizontal rotating bracket 80, and guide the vertical rotating bracket 70 to vertically move with respect to the horizontal rotating bracket 80.

The pillar fixing bracket 90 may have a horizontal guide slot 91 for guiding the rotation in the horizontal direction.

The horizontal guide slot 91 serves to connect the rear ends of the horizontal rotating bracket 80, and guide the horizontal rotating bracket 80 to horizontally move with respect to the pillar fixing bracket 90.

The above description is simply given for illustratively describing the technical spirit of the present disclosure, and those skilled in the art to which the present disclosure pertains will appreciate that various changes and modifications are possible without departing from the essential characteristic of the present disclosure.

Accordingly, the exemplary embodiments disclosed in the present disclosure and the accompanying drawings are intended not to limit but to describe the technical spirit of the present disclosure, and the scope of the technical spirit of the present disclosure is not limited by the exemplary embodiments. The scope of the present disclosure should be construed by the following claims, and all technical ideas within the range equivalent thereto should be construed as being included in the scope of the present disclosure.

INDUSTRIAL APPLICABILITY

The present disclosure provides a multi input and multi output antenna apparatus including: an antenna board having a plurality of antenna elements arranged on a front surface thereof; and a transmitting/receiving module board having a plurality of first heat generation elements provided on a front surface thereof and a plurality of second heat generation elements provided on a rear surface thereof, and disposed to have a separation space from the antenna board, wherein the first and second heat generation elements are electrically driven to generate heat.

The invention claimed is:

1. A multi input and multi output antenna apparatus comprising:
    an antenna board having a plurality of antenna elements arranged on a front surface thereof; and
    a transmitting/receiving module board having a plurality of first heat generation elements provided on a front surface thereof and a plurality of second heat generation elements provided on a rear surface thereof, and disposed to have a space from the antenna board, wherein the first and second heat generation elements are electrically driven to generate heat,
    wherein the heat generated from the plurality of first heat generation elements is radiated to the front of the transmitting/receiving module board, and the heat generated from the plurality of second heat generation elements is radiated to the rear of the transmitting/receiving module board,
    wherein the multi input and multi output antenna apparatus further comprises a plurality of radio-frequency (RF) air lines disposed in the space, and configured to connect the antenna elements of the antenna board to the first heat generation elements of the transmitting/receiving module board.

2. A multi input and multi output antenna apparatus comprising:
    an antenna board having a plurality of antenna elements arranged on a front surface thereof; and
    a transmitting/receiving module board having a plurality of first heat generation elements provided on a front surface thereof and a plurality of second heat generation elements provided on a rear surface thereof, and disposed to have a space from the antenna board, wherein the first and second heat generation elements are electrically driven to generate heat, wherein the heat generated from the plurality of first heat generation elements is radiated to the front of the transmitting/receiving module board, and the heat generated from the plurality of second heat generation elements is radiated to the rear of the transmitting/receiving module board, wherein the multi input and multi output antenna apparatus further comprises:
- a front heat radiation unit configured to radiate the heat generated from the plurality of first heat generation elements; and
- a rear heat radiation unit configured to radiate the heat generated from the plurality of second heat generation elements, wherein the front heat radiation unit comprises:
- a front heat radiation body disposed in contact with the front surface of the transmitting/receiving module board, and having a plurality of main heat radiation pins protruding to the front thereof; and
- a plurality of front unit heat radiation bodies disposed through the front heat radiation body, and having one ends contacted with at least some of the first heat generation elements of the transmitting/receiving module board and the other ends on which a plurality of sub heat radiation pins for radiating heat conducted from the first heat generation elements to the outside are provided.

3. The multi input and multi output antenna apparatus of claim 2, wherein the plurality of sub heat radiation pins of the plurality of front unit heat radiation bodies are exposed to the space.

4. The multi input and multi output antenna apparatus of claim 2, wherein each of the front unit heat radiation bodies comprises:
- a coupling part coupled to the front heat radiation body so as to be contacted with any one of the first heat generation elements;
- a conduction part configured to transfer heat conducted through the coupling part to the space; and
- the plurality of sub heat radiation pins stacked on the outer circumference of the conduction part so as to be spaced apart from each other.

5. A multi input and multi output antenna apparatus comprising:
- an antenna board having a plurality of antenna elements arranged on a front surface thereof; and
- a transmitting/receiving module board having a plurality of first heat generation elements provided on a front surface thereof and a plurality of second heat generation elements provided on a rear surface thereof, and disposed to have a space from the antenna board, wherein the first and second heat generation elements are electrically driven to generate heat, wherein the heat generated from the plurality of first heat generation elements is radiated to the front of the transmitting/receiving module board, and the heat generated from the plurality of second heat generation elements is radiated to the rear of the transmitting/receiving module board, wherein the multi input and multi output antenna apparatus further comprises:
- a front heat radiation unit configured to radiate the heat generated from the plurality of first heat generation elements; and
- a rear heat radiation unit configured to radiate the heat generated from the plurality of second heat generation elements, wherein the rear heat radiation unit comprises:
- a rear heat radiation body disposed in contact with the rear surface of the transmitting/receiving module board, and having a plurality of main heat radiation pins protruding to the rear thereof; and
- a plurality of rear unit heat radiation bodies disposed through the rear heat radiation body, and having one ends contacted with at least some of the second heat generation elements of the transmitting/receiving module board, and the other ends on which a plurality of sub heat radiation pins for radiating heat conducted from the second heat generation elements to the outside are provided.

6. The multi input and multi output antenna apparatus of claim 5, wherein the plurality of main heat radiation pins comprise:
- a left heat radiation pin part inclined upward toward a top-to-bottom center line of the rear heat radiation body from a left side; and
- a right heat radiation pin part inclined upward toward the top-to-bottom center line of the rear heat radiation body from a right side.

7. The multi input and multi output antenna apparatus of claim 5, wherein each of the rear unit heat radiation bodies comprises:
- a coupling part coupled to the rear heat radiation body so as to be contacted with any one of the second heat generation elements;
- a conduction part configured to transfer heat conducted through the coupling part to an outer space corresponding to the outside of the rear heat radiation body; and
- the plurality of sub heat radiation pins stacked on the outer circumference of the conduction part so as to be spaced apart from each other.

8. The multi input and multi output antenna apparatus of claim 7, wherein the plurality of sub heat radiation pins have a heat radiation area that gradually decreases toward the outer space.

9. The multi input and multi output antenna apparatus of claim 7, wherein the rear heat radiation body has a coupling hole to which the coupling part is coupled.

10. The multi input and multi output antenna apparatus of claim 5, wherein the transmitting/receiving module board comprises:
- a first transmitting/receiving board having some of the second heat generation elements mounted thereon, and elongated in the top-to-bottom direction on the left side of the rear heat radiation unit;
- a second transmitting/receiving board having some of the second heat generation elements mounted thereon, and elongated in the top-to-bottom direction on the right side of the rear heat radiation unit; and
- a third transmitting/receiving board having the others of the second heat generation elements mounted thereon, and elongated in the top-to-bottom direction between the first and second transmitting/receiving boards.

11. The multi input and multi output antenna apparatus of claim 10, wherein the rear heat radiation body has a seating groove in which the plurality of second heat generation elements of the third transmitting/receiving board are seated, and which is elongated in the top-to-bottom direction.

12. The multi input and multi output antenna apparatus of claim 11, further comprising a heat radiation exhaust rib formed on the outer surface of the rear heat radiation body having the plurality of main heat radiation pins formed thereon, and protruding from the inner surface toward the outer surface of the rear heat radiation body, such that the seating groove is formed in a recess shape.

13. The multi input and multi output antenna apparatus of claim 12, wherein the heat radiation exhaust rib has a horizontal cross-section having vertices of a triangle, and
the plurality of main heat radiation pins are extended to the vertices of the heat radiation exhaust rib.

14. The multi input and multi output antenna apparatus of claim 13, wherein the plurality of main heat radiation pins comprise:
a left heat radiation pin part inclined upward toward the vertices of the heat radiation exhaust rib from a left side; and
a right heat radiation pin part inclined upward toward the vertices of the heat radiation exhaust rib from a right side,
wherein heat flowing through the left and right heat radiation pin parts is exhausted to the outside through the heat radiation exhaust rib.

* * * * *